US009691645B2

(12) United States Patent
Benjaminson et al.

(10) Patent No.: US 9,691,645 B2
(45) Date of Patent: Jun. 27, 2017

(54) BOLTED WAFER CHUCK THERMAL MANAGEMENT SYSTEMS AND METHODS FOR WAFER PROCESSING SYSTEMS

(71) Applicant: Applied Materials, Inc., Santa Clara, CA (US)

(72) Inventors: David Benjaminson, Santa Clara, CA (US); Dmitry Lubomirsky, Cupertino, CA (US); Ananda Seelavanth Math, Bangalore (IN); Saravanakumar Natarajan, Coimbatore (IN); Shubham Chourey, Indore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/820,422

(22) Filed: Aug. 6, 2015

(65) Prior Publication Data
US 2017/0040191 A1   Feb. 9, 2017

(51) Int. Cl.
*H01L 21/00*   (2006.01)
*H01L 21/67*   (2006.01)
(Continued)

(52) U.S. Cl.
CPC ...... *H01L 21/67103* (2013.01); *H01L 21/324* (2013.01); *H01L 21/68742* (2013.01); *H01L 21/68785* (2013.01)

(58) Field of Classification Search
CPC ............. H01L 21/67103; H01L 21/324; H01L 21/68742; H01L 21/68785
(Continued)

(56) References Cited

U.S. PATENT DOCUMENTS 2,369,620 A   2/1945   Sullivan et al.
3,451,840 A   6/1969   Hough
(Continued)

FOREIGN PATENT DOCUMENTS

EP   1675160 A1   6/2006
JP   S59-126778 A   7/1984
(Continued)

OTHER PUBLICATIONS

U.S. Appl. No. 14/820,365, filed Aug. 6, 2015, first named inventor David Benjaminson, 33 pages.
(Continued)

*Primary Examiner* — Xinning Niu
*Assistant Examiner* — Vu A Vu
(74) *Attorney, Agent, or Firm* — Kilpatrick Townsend & Stockton LLP

(57) ABSTRACT

A workpiece holder includes a puck, first and second heating devices in thermal communication with respective inner and outer portions of the puck, and a thermal sink in thermal communication with the puck. The first and second heating devices are independently controllable, and the first and second heating devices are in greater thermal communication with the puck, than thermal communication of the thermal sink with the puck. A method of controlling temperature distribution of a workpiece includes flowing a heat exchange fluid through a thermal sink to establish a reference temperature to a puck, raising temperatures of radially inner and outer portions of the puck to first and second temperatures greater than the reference temperature, by activating respective first and second heating devices disposed in thermal communication with the radially inner and outer portions of the puck, and placing the workpiece on the puck.

21 Claims, 10 Drawing Sheets

(51) Int. Cl.
*H01L 21/687* (2006.01)
*H01L 21/324* (2006.01)

(58) Field of Classification Search
USPC .................................................. 438/795
See application file for complete search history.

(56) References Cited

U.S. PATENT DOCUMENTS

| | | |
|---|---|---|
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,364,803 A | 12/1982 | Nidola et al. |
| 4,368,223 A | 1/1983 | Kobayashi et al. |
| 4,374,698 A | 2/1983 | Sanders et al. |
| 4,381,441 A | 4/1983 | Desmarais et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,838,990 A | 6/1989 | Jucha et al. |
| 4,851,370 A | 7/1989 | Doklan et al. |
| 4,857,140 A | 8/1989 | Loewenstein |
| 4,865,685 A | 9/1989 | Palmour |
| 4,868,071 A | 9/1989 | Walsh et al. |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Lowenstein et al. |
| 4,913,929 A | 4/1990 | Moslehi et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,994,404 A | 2/1991 | Sheng et al. |
| 5,000,113 A | 3/1991 | Wang et al. |
| 5,006,192 A | 4/1991 | Deguchi |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Frank |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,292,370 A | 3/1994 | Tsai et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,329,207 A | 7/1994 | Cathey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |

(56) References Cited

U.S. PATENT DOCUMENTS

| | | |
|---|---|---|
| 5,567,243 A | 10/1996 | Foster et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasegawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,865,896 A | 2/1999 | Nowak |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,074,512 A | 6/2000 | Collins et al. |
| 6,077,780 A | 6/2000 | Dubin |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |

(56) References Cited

U.S. PATENT DOCUMENTS

| | | | |
|---|---|---|---|
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,161,576 A | 12/2000 | Maher et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson et al. |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,051 B1 | 10/2002 | Sahin et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |

(56) References Cited

U.S. PATENT DOCUMENTS

| | | | |
|---|---|---|---|
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B2 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 * | 4/2008 | Maki ............... H01L 21/67103 219/444.1 |
| 7,364,956 B2 | 4/2008 | Saito |
| 7,365,016 B2 | 4/2008 | Ouellet et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,468,319 B2 | 12/2008 | Lee |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 * | 1/2011 | Satoh ............... H01L 21/3105 117/204 |
| 7,915,139 B1 | 3/2011 | Lang et al. |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,187,486 B1 | 5/2012 | Liu et al. |
| 8,211,808 B2 | 7/2012 | Sapre et al. |
| 8,272,346 B2 | 9/2012 | Bettencourt et al. |
| 8,298,627 B2 | 10/2012 | Minami et al. |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,357,435 B2 | 1/2013 | Lubomirsky |
| 8,368,308 B2 | 2/2013 | Banna et al. |
| 8,390,980 B2 * | 3/2013 | Sansoni ............... H01L 21/6833 361/234 |
| 8,427,067 B2 | 4/2013 | Espiau et al. |

(56) References Cited

U.S. PATENT DOCUMENTS

| | | |
|---|---|---|
| 8,435,902 B2 | 5/2013 | Tang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,148 B2 | 1/2014 | Mitchell et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,679,982 B2 | 3/2014 | Wang et al. |
| 8,679,983 B2 | 3/2014 | Wang et al. |
| 8,702,902 B2 | 4/2014 | Blom et al. |
| 8,741,778 B2 | 6/2014 | Yang et al. |
| 8,747,680 B1 | 6/2014 | Deshpande |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,808,563 B2 | 8/2014 | Wang et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,786 B1 | 10/2015 | Purayath et al. |
| 9,184,055 B2 | 11/2015 | Wang et al. |
| 9,190,293 B2 | 11/2015 | Wang et al. |
| 9,190,302 B2 | 11/2015 | Ni |
| 9,209,012 B2 | 12/2015 | Chen et al. |
| 9,236,265 B2 | 1/2016 | Korolik et al. |
| 9,236,266 B2 | 1/2016 | Zhang et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,275,887 B2 | 3/2016 | Matyushkin et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhange et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 9,425,058 B2 | 8/2016 | Kim et al. |
| 9,437,451 B2 | 9/2016 | Chen et al. |
| 9,449,845 B2 | 9/2016 | Liu et al. |
| 9,449,846 B2 | 9/2016 | Liu et al. |
| 9,449,850 B2 | 9/2016 | Wang et al. |
| 9,472,412 B2 | 10/2016 | Zhang et al. |
| 9,472,417 B2 | 10/2016 | Ingle et al. |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0041444 A1 | 11/2001 | Shields et al. |
| 2001/0047760 A1 | 12/2001 | Mosiehl |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |

(56) References Cited

U.S. PATENT DOCUMENTS

| | | |
|---|---|---|
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0121312 A1 | 9/2002 | Lubomirsky et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0025174 A1 | 2/2003 | Lubomirsky et al. |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0118732 A1 | 6/2003 | Stevens et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0129850 A1 | 7/2003 | Olgado et al. |
| 2003/0131494 A1 | 7/2003 | Lubomirsky et al. |
| 2003/0132319 A1 | 7/2003 | Hytros et al. |
| 2003/0140844 A1 | 7/2003 | Maa et al. |
| 2003/0141018 A1 | 7/2003 | Stevens et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0209443 A1 | 11/2003 | Lubomirsky et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0016637 A1 | 1/2004 | Yang et al. |
| 2004/0018304 A1 | 1/2004 | Chung et al. |
| 2004/0020801 A1 | 2/2004 | Zhao et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099378 A1 | 5/2004 | Kim et al. |
| 2004/0101667 A1 | 5/2004 | O'Loughlin et al. |
| 2004/0108068 A1 | 6/2004 | Senzaki et al. |
| 2004/0115876 A1 | 6/2004 | Goundar et al. |
| 2004/0129671 A1 | 7/2004 | Ji et al. |
| 2004/0134775 A1 | 7/2004 | Yang et al. |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0173454 A1 | 9/2004 | Olgado et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0200499 A1 | 10/2004 | Harvey |
| 2004/0206623 A1 | 10/2004 | D'Ambra et al. |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0051094 A1 | 3/2005 | Schaepkens et al. |
| 2005/0056538 A1 | 3/2005 | Kovarsky et al. |
| 2005/0073051 A1 | 4/2005 | Yamamoto et al. |
| 2005/0079706 A1 | 4/2005 | Kumar et al. |
| 2005/0085031 A1 | 4/2005 | Lopatin et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0101130 A1 | 5/2005 | Lopatin et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0160990 A1 | 7/2005 | Lubomirsky et al. |
| 2005/0167394 A1 | 8/2005 | Liu et al. |
| 2005/0181226 A1 | 8/2005 | Weidman et al. |
| 2005/0181588 A1 | 8/2005 | Kim |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |

(56) References Cited

U.S. PATENT DOCUMENTS

| | | |
|---|---|---|
| 2005/0279454 A1 | 12/2005 | Snijders |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005930 A1 | 1/2006 | Ikeda et al. |
| 2006/0006057 A1 | 1/2006 | Laermer |
| 2006/0011298 A1 | 1/2006 | Lim et al. |
| 2006/0011299 A1 | 1/2006 | Condrashoff et al. |
| 2006/0019456 A1 | 1/2006 | Bu et al. |
| 2006/0019486 A1 | 1/2006 | Yu et al. |
| 2006/0021574 A1 | 2/2006 | Armour et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0062897 A1 | 3/2006 | Gu et al. |
| 2006/0087644 A1 | 4/2006 | McMillin et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0118765 A1 | 6/2006 | Lubomirsky |
| 2006/0118903 A1 | 6/2006 | Cahen et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0210723 A1 | 9/2006 | Ishizaka |
| 2006/0216878 A1 | 9/2006 | Lee |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0292846 A1 | 12/2006 | Pinto et al. |
| 2007/0004201 A1 | 1/2007 | Lubomirsky et al. |
| 2007/0024362 A1 | 2/2007 | Radomski et al. |
| 2007/0025907 A1 | 2/2007 | Rezeq |
| 2007/0048977 A1 | 3/2007 | Lee et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0095367 A1 | 5/2007 | Wang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0227554 A1 | 10/2007 | Satoh et al. |
| 2007/0231109 A1 | 10/2007 | Pak et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0281106 A1 | 12/2007 | Lubomirsky et al. |
| 2007/0287292 A1 | 12/2007 | Li et al. |
| 2007/0296967 A1 | 12/2007 | Gupta et al. |
| 2007/0298585 A1 | 12/2007 | Lubomirsky et al. |
| 2008/0017104 A1* | 1/2008 | Matyushkin ...... H01L 21/67109 118/696 |
| 2008/0020570 A1 | 1/2008 | Naik |
| 2008/0044990 A1 | 2/2008 | Lee |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0102570 A1 | 5/2008 | Fisher et al. |
| 2008/0102640 A1 | 5/2008 | Hassan et al. |
| 2008/0104782 A1 | 5/2008 | Hughes |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142483 A1 | 6/2008 | Hua et al. |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0171407 A1 | 7/2008 | Nakabayashi et al. |
| 2008/0173906 A1 | 7/2008 | Zhu |
| 2008/0182381 A1 | 7/2008 | Kiyotoshi |
| 2008/0182383 A1 | 7/2008 | Lee et al. |
| 2008/0185284 A1 | 8/2008 | Chen et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0001480 A1 | 1/2009 | Cheng |
| 2009/0004849 A1 | 1/2009 | Eun |
| 2009/0014127 A1 | 1/2009 | Shah et al. |
| 2009/0014323 A1 | 1/2009 | Yendler et al. |
| 2009/0017227 A1 | 1/2009 | Fu et al. |
| 2009/0031955 A1 | 2/2009 | Lu et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |

(56) References Cited

U.S. PATENT DOCUMENTS

| | | |
|---|---|---|
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0104789 A1 | 4/2009 | Mallick et al. |
| 2009/0111280 A1 | 4/2009 | Kao et al. |
| 2009/0120368 A1 | 5/2009 | Lubomirsky et al. |
| 2009/0120464 A1 | 5/2009 | Rasheed et al. |
| 2009/0120584 A1 | 5/2009 | Lubomirsky et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0224820 A1 | 9/2009 | Cahen et al. |
| 2009/0255902 A1 | 10/2009 | Satoh et al. |
| 2009/0258162 A1 | 10/2009 | Furuta et al. |
| 2009/0261276 A1 | 10/2009 | Lubomirsky et al. |
| 2009/0266299 A1 | 10/2009 | Rasheed et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277388 A1 | 11/2009 | Lubomirsky |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0294898 A1 | 12/2009 | Feustel et al. |
| 2009/0317978 A1 | 12/2009 | Higashi |
| 2009/0320756 A1 | 12/2009 | Tanaka |
| 2010/0003824 A1 | 1/2010 | Kadkhodayan et al. |
| 2010/0006032 A1 | 1/2010 | Hinckley et al. |
| 2010/0022030 A1 | 1/2010 | Ditizio |
| 2010/0041207 A1 | 2/2010 | Lee et al. |
| 2010/0047080 A1 | 2/2010 | Bruce |
| 2010/0048027 A1 | 2/2010 | Cheng et al. |
| 2010/0048028 A1 | 2/2010 | Rasheed et al. |
| 2010/0055408 A1 | 3/2010 | Lee et al. |
| 2010/0055917 A1 | 3/2010 | Kim |
| 2010/0059724 A1 | 3/2010 | Lubomirsky et al. |
| 2010/0059889 A1 | 3/2010 | Gosset et al. |
| 2010/0062603 A1 | 3/2010 | Ganguly et al. |
| 2010/0071210 A1 | 3/2010 | Tan et al. |
| 2010/0075503 A1 | 3/2010 | Bencher |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0130001 A1 | 5/2010 | Noguchi |
| 2010/0144140 A1 | 6/2010 | Chandrashekar et al. |
| 2010/0147219 A1 | 6/2010 | Hsieh et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0200044 A1 | 8/2010 | Zaban et al. |
| 2010/0203739 A1 | 8/2010 | Becker et al. |
| 2010/0207205 A1 | 8/2010 | Grebs et al. |
| 2010/0240205 A1 | 9/2010 | Son |
| 2010/0258913 A1 | 10/2010 | Lue |
| 2010/0294199 A1 | 11/2010 | Tran et al. |
| 2010/0330814 A1 | 12/2010 | Yokota et al. |
| 2011/0005607 A1 | 1/2011 | Desbiolles et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0081782 A1 | 4/2011 | Liang et al. |
| 2011/0100489 A1 | 5/2011 | Orito |
| 2011/0100832 A1 | 5/2011 | Lubomirsky et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0136347 A1 | 6/2011 | Kovarsky et al. |
| 2011/0143542 A1 | 6/2011 | Feurprier et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230052 A1 | 9/2011 | Tang et al. |
| 2011/0232737 A1 | 9/2011 | Ruletzki et al. |
| 2011/0266252 A1 | 11/2011 | Thadani et al. |
| 2011/0266682 A1 | 11/2011 | Edelstein et al. |
| 2011/0267132 A1 | 11/2011 | Lubomirsky et al. |
| 2011/0294300 A1 | 12/2011 | Zhang et al. |
| 2011/0298061 A1 | 12/2011 | Siddiqui et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0052683 A1 | 3/2012 | Kim et al. |
| 2012/0068242 A1 | 3/2012 | Shin et al. |
| 2012/0073501 A1 | 3/2012 | Lubomirsky et al. |
| 2012/0074126 A1 | 3/2012 | Bang et al. |
| 2012/0103518 A1 | 5/2012 | Kakimoto |
| 2012/0103970 A1 | 5/2012 | Lubomirsky et al. |
| 2012/0104564 A1 | 5/2012 | Won et al. |
| 2012/0129354 A1 | 5/2012 | Luong |
| 2012/0135576 A1 | 5/2012 | Lee et al. |
| 2012/0145079 A1 | 6/2012 | Lubomirsky et al. |
| 2012/0148369 A1* | 6/2012 | Michalski ............. F16B 43/001 411/371.1 |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0181599 A1 | 7/2012 | Lung |
| 2012/0182808 A1 | 7/2012 | Lue et al. |
| 2012/0193456 A1 | 8/2012 | Lubomirsky et al. |
| 2012/0196447 A1 | 8/2012 | Yang et al. |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |

(56) References Cited

U.S. PATENT DOCUMENTS

| | | |
|---|---|---|
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0258600 A1 | 10/2012 | Godet et al. |
| 2012/0267346 A1 | 10/2012 | Kao et al. |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012032 A1 | 1/2013 | Liu et al. |
| 2013/0023122 A1 | 1/2013 | Nemani et al. |
| 2013/0023124 A1 | 1/2013 | Nemani et al. |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0089988 A1 | 4/2013 | Wang et al. |
| 2013/0098868 A1 | 4/2013 | Nishimura et al. |
| 2013/0105085 A1 | 5/2013 | Yousif et al. |
| 2013/0105086 A1 | 5/2013 | Banna et al. |
| 2013/0105088 A1 | 5/2013 | Pal et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0109190 A1 | 5/2013 | Lill et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0161726 A1 | 6/2013 | Kim et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0207513 A1 | 8/2013 | Lubomirsky et al. |
| 2013/0216821 A1 | 8/2013 | Sun et al. |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0273313 A1 | 10/2013 | Sun et al. |
| 2013/0273327 A1 | 10/2013 | Sun et al. |
| 2013/0276980 A1 | 10/2013 | Lubomirsky et al. |
| 2013/0279066 A1* | 10/2013 | Lubomirsky ..... H01L 21/67103 361/234 |
| 2013/0284369 A1 | 10/2013 | Kobayashi et al. |
| 2013/0284370 A1 | 10/2013 | Kobayashi et al. |
| 2013/0284373 A1* | 10/2013 | Sun ............... C23F 1/08 156/345.34 |
| 2013/0284374 A1 | 10/2013 | Lubomirsky et al. |
| 2013/0286530 A1 | 10/2013 | Lin et al. |
| 2013/0288483 A1 | 10/2013 | Sadjadi et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1* | 12/2013 | Benedetti ............. F16B 33/006 411/3 |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0030486 A1 | 1/2014 | Sun et al. |
| 2014/0030533 A1 | 1/2014 | Sun et al. |
| 2014/0057447 A1 | 2/2014 | Yang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0124364 A1 | 5/2014 | Yoo et al. |
| 2014/0134847 A1 | 5/2014 | Seya |
| 2014/0141621 A1 | 5/2014 | Ren et al. |
| 2014/0152312 A1 | 6/2014 | Snow et al. |
| 2014/0154158 A1 | 6/2014 | Lubomirsky et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0177123 A1 | 6/2014 | Thach et al. |
| 2014/0186772 A1 | 7/2014 | Pohlers et al. |
| 2014/0190410 A1 | 7/2014 | Kim |
| 2014/0199851 A1 | 7/2014 | Nemani et al. |
| 2014/0209027 A1 | 7/2014 | Lubomirsky et al. |
| 2014/0209245 A1 | 7/2014 | Yamamoto et al. |
| 2014/0209596 A1 | 7/2014 | Lubomirsky et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai |
| 2014/0248780 A1 | 9/2014 | Ingle et al. |
| 2014/0252134 A1 | 9/2014 | Chen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0334060 A1 | 11/2014 | Parkhe et al. |
| 2014/0342532 A1 | 11/2014 | Zhu et al. |
| 2014/0342569 A1 | 11/2014 | Zhu et al. |
| 2014/0349477 A1 | 11/2014 | Chandrashekar et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0047786 A1 | 2/2015 | Lubomirsky et al. |
| 2015/0060265 A1 | 3/2015 | Cho et al. |
| 2015/0064809 A1 | 3/2015 | Lubomirsky |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0083042 A1 | 3/2015 | Kobayashi et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |

(56) References Cited

U.S. PATENT DOCUMENTS

| | | |
|---|---|---|
| 2015/0132953 A1 | 5/2015 | Nowling |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko |
| 2015/0221541 A1 | 8/2015 | Nemani et al. |
| 2015/0235809 A1 | 8/2015 | Ito et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270105 A1 | 9/2015 | Kobayashi et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0311043 A1 | 10/2015 | Sun et al. |
| 2015/0332930 A1 | 11/2015 | Wang et al. |
| 2015/0340225 A1 | 11/2015 | Kim et al. |
| 2015/0357201 A1 | 12/2015 | Chen et al. |
| 2015/0357205 A1 | 12/2015 | Wang et al. |
| 2015/0366004 A1 | 12/2015 | Nangoy et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0056167 A1 | 2/2016 | Wang et al. |
| 2016/0064233 A1 | 3/2016 | Wang et al. |
| 2016/0079072 A1 | 3/2016 | Wang et al. |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0104606 A1 | 4/2016 | Park et al. |
| 2016/0118268 A1 | 4/2016 | Ingle et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0181112 A1 | 6/2016 | Xue et al. |
| 2016/0189933 A1 | 6/2016 | Kobayashi et al. |
| 2016/0204009 A1 | 7/2016 | Nguyen et al. |
| 2016/0222522 A1 | 8/2016 | Wang et al. |
| 2016/0225651 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |

FOREIGN PATENT DOCUMENTS

| | | |
|---|---|---|
| JP | H01-200627 A | 8/1989 |
| JP | H02-114525 A | 4/1990 |
| JP | H07-153739 A | 6/1995 |
| JP | H08-264510 A | 10/1996 |
| JP | 2003-174020 A | 6/2003 |
| JP | 4763293 B2 | 8/2011 |
| JP | 2013-243418 A | 12/2013 |
| KR | 10-2000-008278 A | 2/2000 |
| KR | 10-2005-0042701 A | 5/2005 |
| KR | 10-2008-0063988 A | 7/2008 |
| KR | 10-2009-0128913 A | 12/2009 |
| KR | 10-2011-0086540 A | 7/2011 |
| KR | 10-2011-0126675 A | 11/2011 |
| KR | 10-2012-0082640 A | 7/2012 |
| WO | 2009-084194 A1 | 7/2009 |
| WO | 2010-010706 | 1/2010 |

OTHER PUBLICATIONS

Manual No. TQMA72E1. "Bayard-Alpert Pirani Gauge FRG-730: Short Operating Instructions" Mar. 2012. Agilent Technologies, Lexington, MA 02421, USA. pp. 1-45.

International Search Report and Written Opinion of PCT/US2016/045543 mailed Nov. 17, 2016, all pages.

H. Xiao, Introduction to Semiconductor Manufacturing Technology, published by Prentice Hall, 2001, ISBN 0-13-022404-9, pp. 354-356.

* cited by examiner

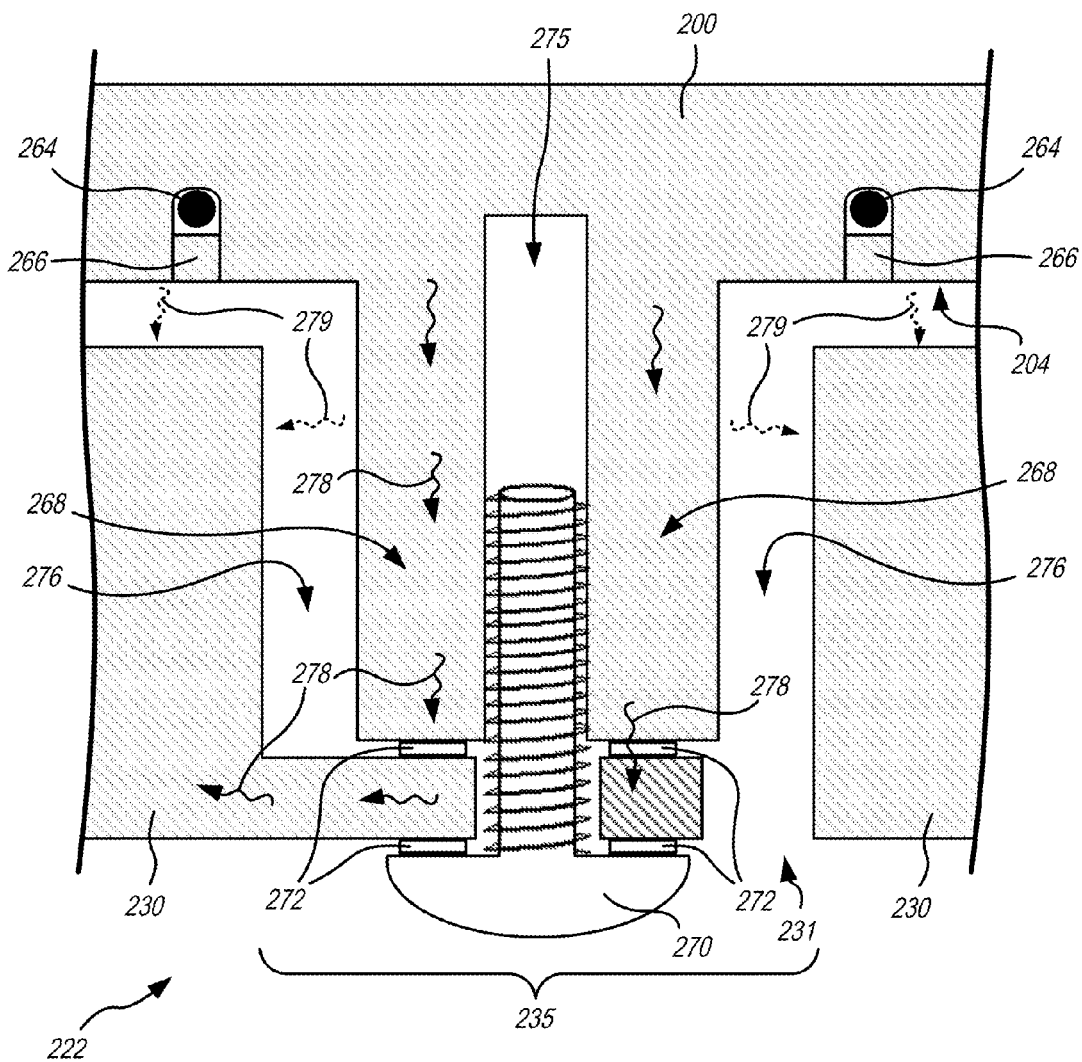
FIG. 6A
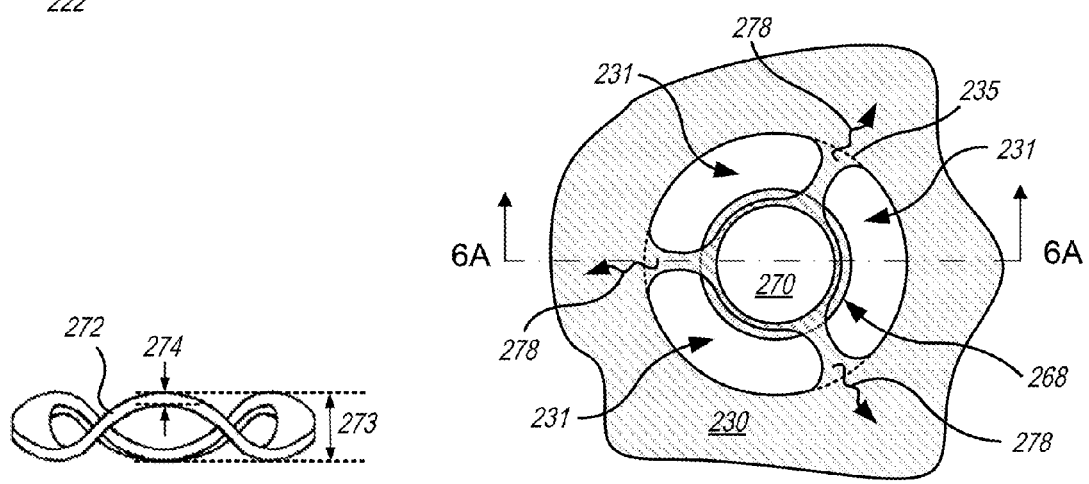
FIG. 6B
FIG. 6C

BOLTED WAFER CHUCK THERMAL MANAGEMENT SYSTEMS AND METHODS FOR WAFER PROCESSING SYSTEMS

CROSS-REFERENCE TO RELATED APPLICATIONS

The present disclosure is related to the subject matter of commonly-owned U.S. patent application Ser. No. 14/820,365, which is being filed concurrently with this application on Aug. 6, 2015, and is incorporated herein by reference in its entirety for all purposes.

TECHNICAL FIELD

The present disclosure applies broadly to the field of processing equipment. More specifically, systems and methods for providing spatially tailored processing on a workpiece are disclosed.

BACKGROUND

Integrated circuits and other semiconductor products are often fabricated on surfaces of substrates called "wafers." Sometimes processing is performed on groups of wafers held in a carrier, while other times processing and testing are performed on one wafer at a time. When single wafer processing or testing is performed, the wafer may be positioned on a wafer chuck. Other workpieces may also be processed on similar chucks. Chucks can be temperature controlled in order to control temperature of a workpiece for processing.

SUMMARY

In an embodiment, a workpiece holder positions a workpiece for processing. The workpiece holder includes a substantially cylindrical puck, a first heating device disposed in thermal communication with a radially inner portion of the puck, a second heating device disposed in thermal communication with a radially outer portion of the puck, and a thermal sink disposed in thermal communication with the puck. The first and second heating devices are independently controllable with respect to one another, and the first and second heating devices are in greater respective degrees of thermal communication with the puck, than a degree of thermal communication of the thermal sink with the puck.

In an embodiment, a method of controlling spatial temperature distribution of a workpiece includes providing a reference temperature to a substantially cylindrical puck by flowing a heat exchange fluid at a controlled temperature through channels in a thermal sink that is in thermal communication with the puck, raising a temperature of a radially inner portion of the puck to a first temperature that is greater than the reference temperature, by activating a first heating device disposed in thermal communication with the radially inner portion of the puck, raising a temperature of a radially outer portion of the puck to a second temperature that is greater than the reference temperature, by activating a second heating device disposed in thermal communication with the radially outer portion of the puck, and placing the workpiece on the puck.

In an embodiment, a workpiece holder that positions a workpiece for processing includes a substantially cylindrical puck that is characterized by a cylindrical axis and a substantially planar top surface. The puck defines two radial thermal breaks. The first one thermal break is characterized as a radial recess that intersects a bottom surface of the puck at a first radius, and extends from the bottom surface through at least one-half of a thickness of the puck. The second thermal break is characterized as a radial recess that intersects the top surface of the puck at a second radius that is greater than the first radius, and extends from the top surface through at least one-half of the thickness of the puck. The first and second thermal breaks define a demarcation between a radially inner portion of the puck and a radially outer portion of the puck. The puck includes a first heating device embedded within the radially inner portion of the puck, and a second heating device embedded within the radially outer portion of the puck. The workpiece holder also includes a thermal sink that extends substantially beneath the bottom surface of the puck, the thermal sink including a metal plate that flows a heat exchange fluid through channels defined therein, to maintain a reference temperature for the puck. The thermal sink mechanically and thermally couples with the puck at attachment points that provide a degree of thermal communication between the thermal sink and the puck that is less than a degree of thermal communication between each of the first and second heating devices and the puck.

BRIEF DESCRIPTION OF THE DRAWINGS

FIG. 6A is a detailed view of a portion of the puck and optional thermal sink of FIG. 4, in the vicinity of a fastener.

FIG. 6B schematically illustrates an embodiment of a wave washer in an uncompressed state, in accord with an embodiment.

FIG. 6C provides an upwardly looking, bottom plan view of the puck and optional thermal sink illustrated in FIG. 6A.

DETAILED DESCRIPTION

Figure 1:
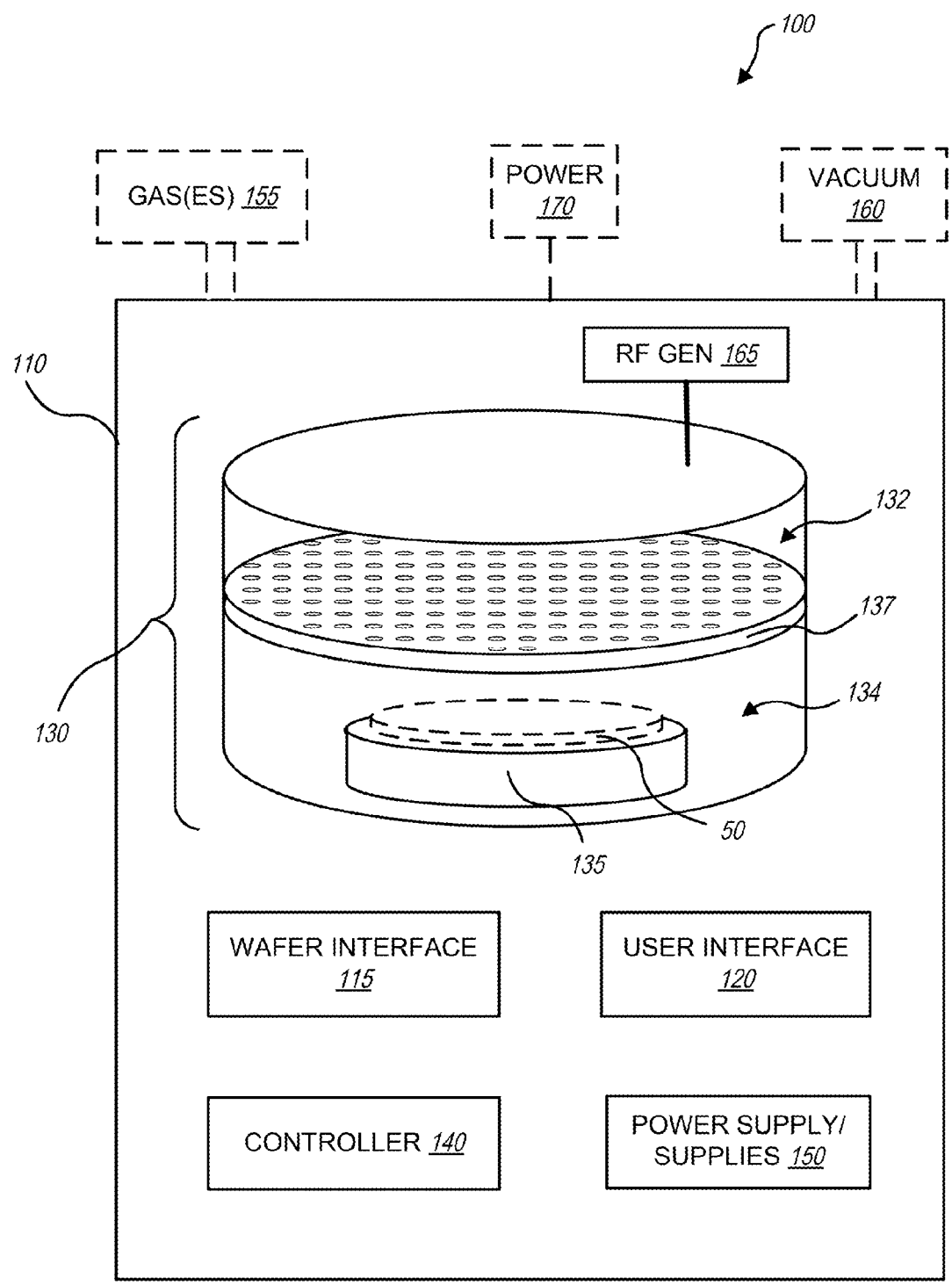
FIG. 1 schematically illustrates major elements of a processing system having a workpiece holder, according to an embodiment.

The present disclosure may be understood by reference to the following detailed description taken in conjunction with the drawings described below, wherein like reference numerals are used throughout the several drawings to refer to similar components. It is noted that, for purposes of illustrative clarity, certain elements in the drawings may not be drawn to scale. Specific instances of an item may be referred to by use of a numeral following a dash (e.g., heaters 220-1, 220-2) while numerals without parentheses refer to any such item (e.g., heaters 220). In instances where multiple instances of an item are shown, only some of the instances may be labeled, for clarity of illustration.

FIG. 1 schematically illustrates major elements of a wafer processing system 100. System 100 is depicted as a single wafer, semiconductor wafer plasma processing system, but it will be apparent to one skilled in the art that the techniques and principles herein are applicable to wafer processing systems of any type (e.g., systems that do not necessarily process wafers or semiconductors, and do not necessarily utilize plasmas for the processing). Processing system 100 includes a housing 110 for a wafer interface 115, a user interface 120, a plasma processing unit 130, a controller 140 and one or more power supplies 150. Processing system 100 is supported by various utilities that may include gas(es) 155, external power 170, vacuum 160 and optionally others. Internal plumbing and electrical connections within processing system 100 are not shown, for clarity of illustration.

Processing system 100 is shown as a so-called indirect plasma processing system that generates a plasma in a first location and directs the plasma and/or plasma products (e.g., ions, molecular fragments, energized species and the like) to a second location where processing occurs. Thus, in FIG. 1, plasma processing unit 130 includes a plasma source 132 that supplies plasma and/or plasma products for a process chamber 134. Process chamber 134 includes one or more workpiece holders 135, upon which wafer interface 115 places a workpiece 50 (e.g., a semiconductor wafer, but could be a different type of workpiece) to be held for processing. When workpiece 50 is a semiconductor wafer, workpiece holder 135 is often referred to as a wafer chuck. In operation, gas(es) 155 are introduced into plasma source 132 and a radio frequency generator (RF Gen) 165 supplies power to ignite a plasma within plasma source 132. Plasma and/or plasma products pass from plasma source 132 through a diffuser plate 137 to process chamber 134, where workpiece 50 is processed. Alternatively or in addition to plasma from plasma source 132, a plasma may also be ignited within process chamber 134 for direct plasma processing of workpiece 50.

Embodiments herein provide new and useful functionality for plasma processing systems. Semiconductor wafer sizes have increased while feature sizes have decreased significantly over the years, so that more integrated circuits with greater functionality can be harvested per wafer processed. Processing smaller features while wafers grow larger requires significant improvements in processing uniformity. Because chemical reaction rates are often temperature sensitive, temperature control across wafers during processing is often key to uniform processing.

Also, some types of processing can have radial effects (e.g., processing that varies from center to edge of a wafer). Some types of process equipment control these effects better than others, that is, some achieve high radial process uniformity while others do not. Embodiments herein recognize that radial effects are advantageously controlled, and it would be further advantageous to be able to provide radial processing that can be tailored to compensate for processing that cannot achieve such control. For example, consider a case in which a layer is deposited on a wafer and then selectively etched off, as is common in semiconductor processing. If the deposition step is known to deposit a thicker layer at the wafer's edge than at its center, a compensating etch step would advantageously provide a higher etch rate at the wafer's edge than at its center, so that the deposited layer would be etched to completion at all parts of the wafer at the same time. Similarly, if an etch process were known to have a center-to-edge variation, a compensating deposition preceding the etch process could be adjusted to provide a corresponding variation.

In many such cases of processing with radial effects, a compensating process can be provided by providing explicit center-to-edge temperature variation, because temperature often substantially influences reaction rates of processes.

Figure 2:
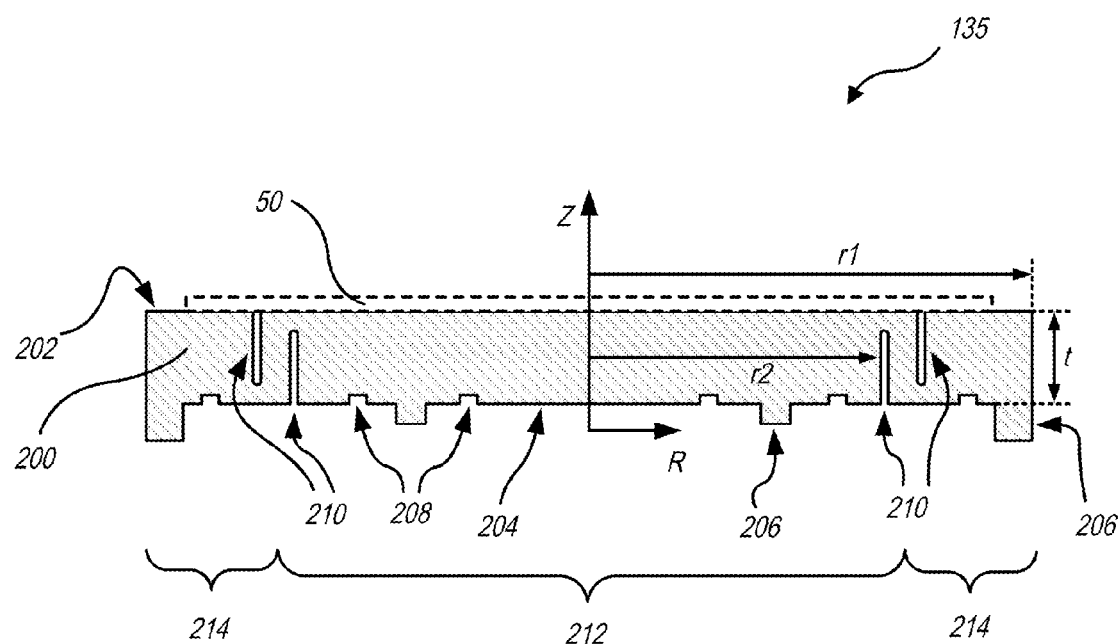
FIG. 2 is a schematic cross sectional diagram illustrating exemplary construction details of a workpiece holder of FIG. 1.

FIG. 2 is a schematic cross section that illustrates exemplary construction details of workpiece holder 135, FIG. 1. As shown in FIG. 2, workpiece holder 135 includes a puck 200 that is substantially cylindrical, and is characterized in terms of having a puck radius $r1$ in a radial direction R from a cylindrical axis Z. In use, a workpiece 50 (e.g., a wafer) may be placed on puck 200 for processing. A bottom surface 204 of puck 200 is taken to be a median bottom surface height of puck 200; that is, a plane that defines the typical bottom surface height of puck 200 in the direction of axis Z exclusive of features such as edge rings or other protrusions 206, or indentations 208, that puck 200 may form as attachment points for other hardware. Similarly, a top surface 202 is taken to be a planar surface configured to accommodate workpiece 50, irrespective of grooves that may be formed therein (e.g., as vacuum channels, see FIG. 4) and/or other features that retain workpiece 50. All such protrusions, indentations, grooves, rings and the like do not, in the context of this specification, detract from the characterization of puck 200 as "substantially cylindrical." Puck 200 may also be characterized in terms of having a thickness t between bottom surface 204 and top surface 202, as shown. In certain embodiments, puck radius $r1$ is at least four times puck thickness t, but this is not a requirement.

Puck 200 defines one or more radial thermal breaks 210, as shown. Thermal breaks 210 are radial recesses defined in puck 200, that intersect at least one of top surface 202 or bottom surface 204 of puck 200. Thermal breaks 210 act as the term implies, that is, they provide thermal resistance, between a radially inner portion 212, and a radially outer portion 214, of puck 200. This facilitates explicit radial (e.g., center-to-edge) thermal control of the radially inner and outer portions of puck 200, which is advantageous in terms of either providing precise thermal matching of the inner and outer portions, or of providing deliberate temperature variation across the inner and outer portions. Thermal breaks 210 can be characterized in terms of having a thermal break depth and a thermal break radius. Depth of thermal breaks 210 can vary among embodiments, but the thermal break depth usually exceeds one-half of thickness t. Radial positioning of thermal breaks 210 can also vary among embodiments, but the thermal break radius $r2$ is usually at least one-half of puck radius $r1$, and in other embodiments $r2$ may be three-fourths, four-fifths, five sixths or more of puck radius $r1$. Certain embodiments may use a single thermal break 210, while other embodiments may use two thermal breaks 210 (as shown in FIG. 2) or more. A demarcation point between radially inner portion 212 and radially outer portion 214 is illustrated as a radially average position between two thermal breaks 210, but in embodiments having a single thermal break 210, such demarcation point can be considered to be the radial midpoint of the single thermal break 210.

Figure 3:
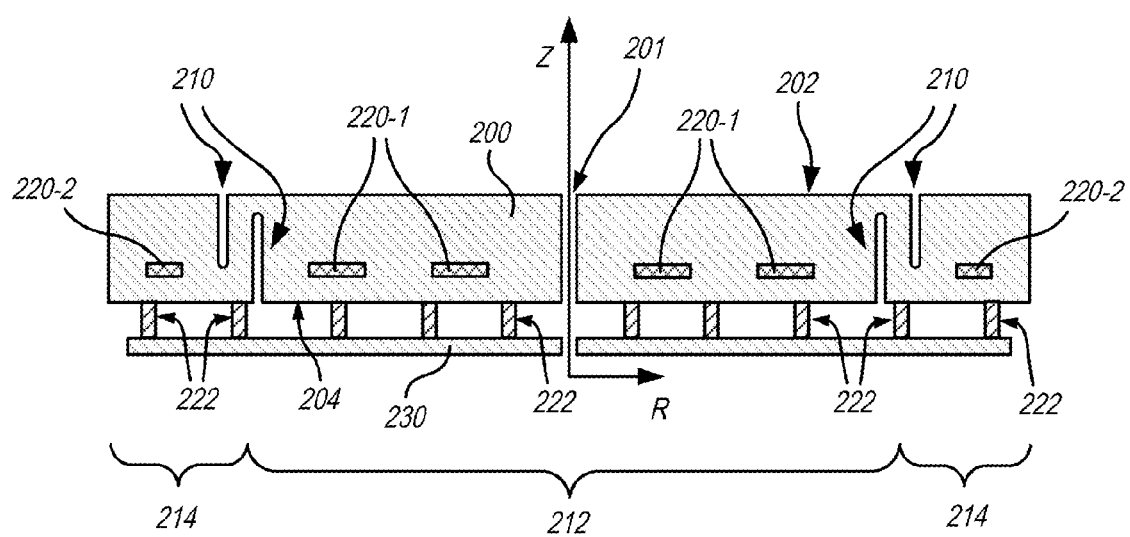
FIG. 3 is a schematic cross sectional diagram illustrating integration of heaters and a thermal sink with inner and outer portions of a puck that forms part of the workpiece holder of FIG. 1, in accord with an embodiment.

One way in which thermal breaks, as illustrated in FIG. 2, can be used advantageously is to provide radially applied heating and/or cooling to inner portion 212 and outer portion 214 of puck 200. FIG. 3 is a schematic cross sectional diagram illustrating integration of heaters and a thermal sink with inner and outer portions of puck 200. Some mechanical details of puck 200 are not shown in FIG. 3, for clarity of illustration. FIG. 3 illustrates a central channel 201 defined by puck 200 and an optional thermal sink 230. Central channel 201 is described in connection with FIG. 4. Inner heaters 220-1 and outer heaters 220-2 are disposed in thermal communication with puck 200; heaters 220 are shown as embedded within puck 200, although this is not required. It may be advantageous for heaters 220 to be placed across large portions of puck 200, but the distribution of heaters 220 across surface 204 can vary in embodiments. Heat provided by heaters 220 will substantially control the temperatures of inner portion 212 and outer portion 214 of puck 200; thermal breaks 210 assist in thermally isolating portions 212 and 214 from one another, to improve the precision of thermal control thereof. Heaters 220 are typically resistive heaters, but other types of heaters (e.g., utilizing forced gas or liquid) may be used.

Optional thermal sink 230 may also be provided. Thermal sink 230 may be controlled to present a lower temperature than typical operating temperatures, for example by flowing a heat exchange fluid at a controlled temperature therethrough, or by using a cooling device such as a Peltier cooler. When present, thermal sink 230 provides several advantages. One such advantage is to provide a reference temperature toward which all portions of puck 200 will have, in the absence of heat provided by heaters 220. That is, although heaters 220 can provide heat, such heat would ordinarily propagate, in all directions, throughout puck 200. Thermal sink 230 provides the ability to drive all portions of puck 200 to lower temperatures, such that if a heater 220 is located at a specific portion of puck 200, the heat generated by the heater does not simply diffuse throughout puck 200 in every direction, but heats a portion of puck 200 where the heat from the heater 200 locally exceeds the tendency of thermal sink 230 to remove the heat. When present, thermal sink 230 may be thermally and/or mechanically coupled with puck 200 at a plurality of attachment points 222 (shown schematically in FIG. 3, although attachment points 222 may not resemble what is shown in FIG. 3; see FIGS. 6A, 6B and 6C). Attachment points 222 are advantageously numerous and spread evenly about surface 204 of puck 200. Attachment points 222 provide substantially all of the thermal communication of puck 200 with thermal sink 230, the numerous and evenly spread arrangement of attachment points 222 is provided so that the reference temperature provided is uniformly applied. For example, a puck 200 that is at least ten inches in diameter might have at least twenty attachment points or more, and a puck 200 that is at least twelve inches in diameter might have at least thirty attachment points, or many more.

A related advantage is that thermal sink 230 can provide rapid thermal sinking capability such that when temperature settings of heaters 220 (e.g., electrical currents passing through resistive wires) decrease, adjacent portions of puck 200 respond with a relatively rapid temperature decrease. This provides the benefit of being able, for example, to load workpiece 50 onto puck 200, provide heat through heaters 220, and achieve rapid stabilization of temperatures on workpiece 50 so that processing can begin quickly, to maximize system throughput. Without thermal communication allowing some heat to dissipate to thermal sink 230, temperatures reached by portions of puck 200 would decrease only as fast as other heat dissipation paths would allow.

Heaters 220 and thermal sink 230 are typically disposed in differing degrees of thermal communication with puck 200; for example heaters 220 may be said to be in direct thermal communication with puck 200, while thermal sink is in indirect thermal communication with puck 200. That is, heaters 220 are typically positioned for a high degree of thermal coupling with puck 200, with thermal sink 230 being positioned for a lesser degree of thermal coupling with puck 200 (at least, a lesser degree of thermal coupling with puck 200 than heaters 220). Also, heaters 220 have sufficient heat generation capability that heat applied by heaters 220 can overwhelm the thermal coupling of puck 200 with thermal sink 230, so that heaters 220 can raise the temperature of inner portion 212 and outer portion 214 of puck 200, even while some of the heat generated by heaters 200 dissipates through thermal sink 230. Thus, heat provided by heaters 220 can, but does not immediately, dissipate through thermal sink 230. In embodiments, placement and degrees of thermal coupling among puck 200, heaters 220 and thermal sink 230 may be adjusted according to principles herein, in order to balance considerations such as temperature uniformity within each of inner portion 212 and outer portion 214, rapidity of thermal stabilization, manufacturing complexity and cost, and overall energy consumption.

Yet another advantage of thermal sink 230 is to confine heat generated by heaters 220 to the vicinity of puck 200. That is, thermal sink 230 can provide a thermal upper limit for adjacent system components to protect such components from high temperatures generated at puck 200. This may improve mechanical stability of the system and/or prevent damage to temperature sensitive components.

Heaters 220 and thermal sink 230 may be implemented in various ways. In an embodiment, heaters 220 are provided by cable type heating elements that are integrated with a puck 200 and then (optionally) with thermal sink 230 to form a wafer chuck assembly. Embodiments designed, assembled and operated as disclosed herein allow explicit temperature control of workpiece (e.g., wafer) edge regions relative to center regions, and facilitate processing with explicit center to edge temperature control that is typically not achievable with prior art systems.

Figure 4:
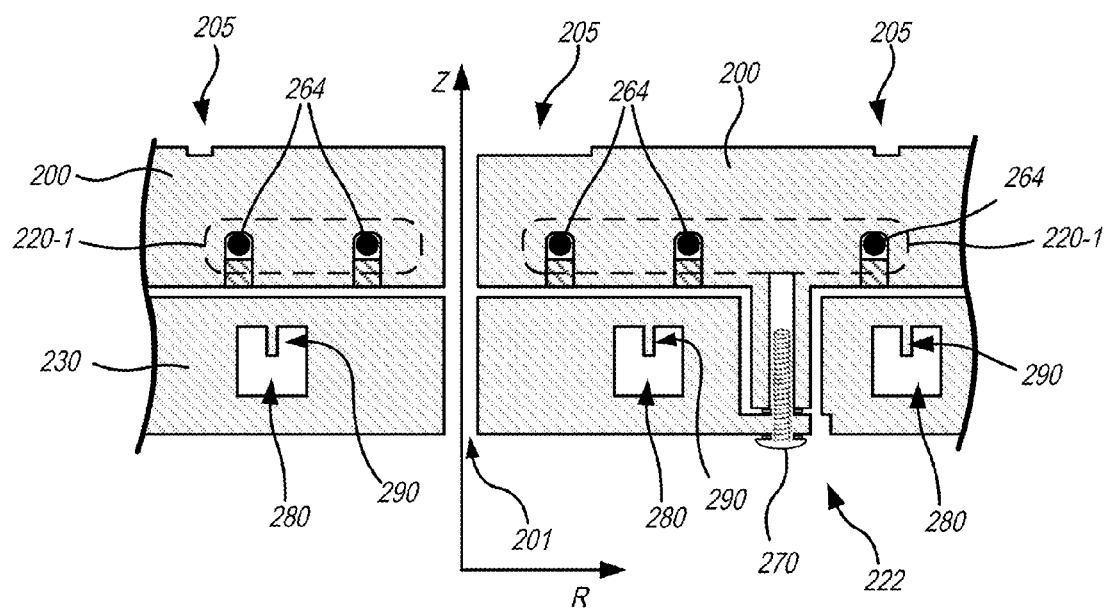
FIG. 4 is a schematic cross-sectional view that illustrates a portion of a wafer chuck, that illustrates features of a puck, a resistive heater, and a thermal sink, in accord with an embodiment.

FIG. 4 is a schematic cross-sectional view that illustrates a portion of a wafer chuck, that illustrates features of puck 200, a resistive heater acting as heater 220-1, and thermal sink 230. FIG. 4 represents a portion of the wafer chuck that is near a cylindrical axis Z thereof, and is not drawn to scale, for illustrative clarity of smaller features. Puck 200 is typically formed of an aluminum alloy, for example of the well-known "6061" alloy type. Puck 200 is shown as defining surface grooves or channels 205 that connect on upper surface 202 of puck 200, and with central channel 201 that is centered about axis Z. Vacuum may be supplied to central channel 201, reducing pressure within channels 205 so that atmospheric pressure (or gas pressure of relatively high pressure plasmas, or low pressure deposition systems, such as around 10-20 Torr) will urge workpiece 50 (see FIGS. 1, 2) against puck 200, providing good thermal communication between puck 200 and workpiece 50.

Inner resistive heater 220-1 is illustrated in FIG. 4, but it should be understood that the illustration and following description of inner resistive heater 220-1 apply equally to outer resistive heater 220-2. Resistive heater 220-1 includes a cable heater 264 that winds in a spiral or other pattern within puck 200. Cable heater 264 is assembled into puck 200 by placing it within grooves in puck 200 and capping the grooves (see FIG. 5). After assembly of cable heater 264 as inner resistive heater 200-1 (and a second cable heater as outer resistive heater 200-2) puck 200 is assembled to thermal sink 230 by means of fasteners 270. Areas of both puck 200 and thermal sink 230 that provide attachment points for fasteners 270 are arranged to manage heat transfer characteristics between puck 200 and thermal sink 230 around fasteners 270, as discussed in more detail further below (see FIGS. 6A, 6B, 6C).

Figure 5:
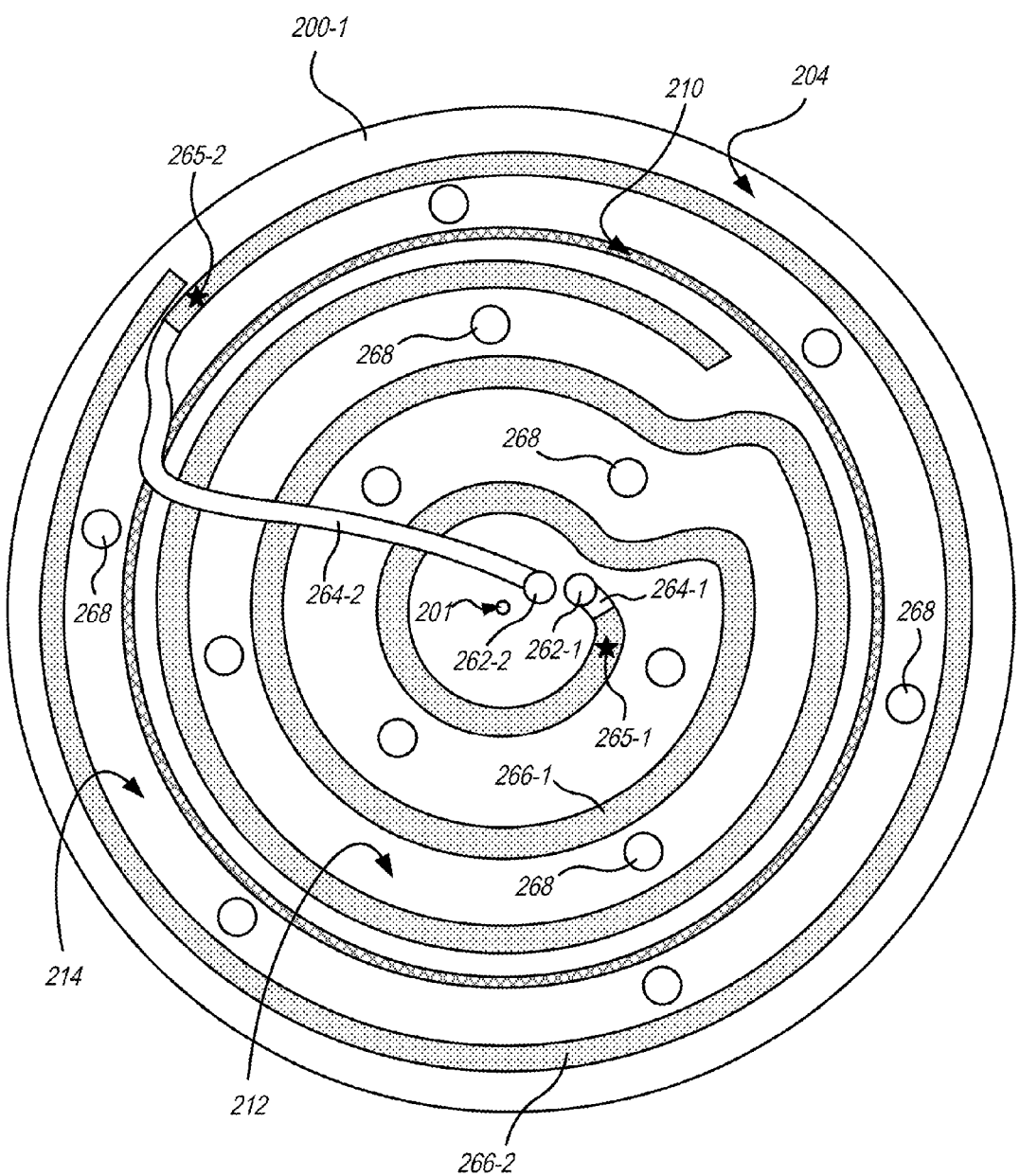
FIG. 5 schematically illustrates an underside of a puck having cable heaters installed therein as inner and outer resistive heaters, in accord with an embodiment.

FIG. 5 schematically illustrates an underside of a puck 200-1 having cable heaters 264-1 and 264-2 installed therein as inner and outer resistive heaters respectively. A thermal break 210 is a recess defined in bottom surface 204 of puck 200-1 and forms a radial demarcation between inner portion 212 and outer portion 214 of puck 200 (see FIGS. 2, 3). Cable heater 264-1 extends from a connector 262-1 along a roughly spiral path that is laid out for uniform heat transfer to all areas of inner portion 212. A heater cap 266-1 is illustrated as a shaded portion of the spiral path; heater cap 266-1 is coupled in place after cable heater 264-1 is put into place. In an embodiment, heater cap 266-1 is a fillet that is pre-formed into a shape of the groove in which cable heater 264-1 is installed, and is secured into place. Heater cap 266-1 may for example be welded into place using electron beam welding, but could also be secured with adhesives or fillers (e.g., epoxy). The fillet is preferably welded into place along at least part of an arc length of the cable heater, but need not be welded along its entire arc length (e.g., portions may not be welded in order to avoid damage to overlying structures, such as cable heater 264-2). In an embodiment, heater cap 266-1 is welded into place using electron beam welding. A cold-to-hot transition point 265-1 indicates where conductive wires in cable heater 264-1, extending from connector 262-1 and hidden underneath heater cap 266-1, connect with resistive materials within cable heater 264-1. Thus, little heat is generated between connector 262-1 and transition point 265-1, but a uniform amount of heat per unit length is generated in cable heater 264-1 past transition point 265-1. Cable heater 264-2 extends from a connector 262-2, first radially outwards from a central region of puck 200 (where connections are made through a shaft of the wafer chuck), then along a roughly circular path that is laid out for uniform heat transfer to outer portion 214. A heater cap 266-2 is illustrated as a shaded portion of the spiral path; heater cap 266-2 is coupled in place after cable heater 264-2 is put into place. In an embodiment, heater cap 266-2 is a fillet that is pre-formed into a shape of the groove in which cable heater 264-2 is installed, and is welded into place using electron beam welding. Like heater cap 266-1, the fillet forming heater cap 266-2 is preferably welded into place along at least part of its arc length, but need not be welded along its entire arc length. A cold-to-hot transition point 265-2 indicates where conductive wires in cable heater 264-2, extending from connector 262-2 and hidden underneath heater cap 266-2, connect with resistive materials within cable heater 264-2. Thus, little heat is generated between connector 262-2 and transition point 265-2, but a uniform amount of heat per unit length is generated in cable heater 264-2 past transition point 265-2. A set of protrusions 268 are also illustrated in FIG. 5. Protrusions 268 are protrusions from bottom surface 204 out of the plane of the drawing (e.g., such that they will face thermal sink 230, see FIG. 3). Protrusions 268 form locations for attachment points 222, cooperate with fasteners 270, FIG. 4, and are discussed in further detail below in connection with FIGS. 6A, 6B.

FIG. 6A is a detailed view of a portion of puck 200 and optional thermal sink 230 as shown in FIG. 4, in the vicinity of fastener 270. Puck 200 includes cable heater 264 sealed into puck 200 with heater cap 266, as discussed above in connection with FIG. 5. As noted further above, optional thermal sink 230 can provide a reference temperature for puck 200, yet it is desirable that thermal sink 230 and puck 200 be arranged for a lesser degree of thermal communication than between puck 200 and heaters 220. Therefore, attachment points that allow thermal communication between thermal sink 230 and puck 200 are advantageously arranged to manage thermal transfer characteristics therebetween. For example, puck 200 and thermal sink 230 may be fabricated such that a lateral gap 276 exists between protrusion 268 and thermal sink 230, as shown. That is, a thickness of thermal sink 230 is reduced in a thinned region 235, in the vicinity of protrusion 268, and a lateral extent of thinned region 235 is greater than a lateral extent of protrusion 268, forming lateral gap 276 between protrusion 268 and a full thickness portion of thermal sink 230. Thermal sink 230 forms an aperture for fastener 270 to pass through, and protrusion 268 defines an internal void 275, a portion of which may be internally threaded for fastener 270 to couple thereto. However, void 275 may be longer than a length of fastener 270, for example as shown in FIG. 6A, to limit thermal transfer from puck 200 through protrusion 268. The physical point of attachment of puck 200 to thermal sink 230 includes protrusion 268, fastener 270, and a pair of washers 272. Major heat transfer paths in the vicinity of fastener 270 are shown in FIGS. 6A and 6B as solid, wavy arrows 278, while minor (e.g., radiative) heat transfer paths are shown as broken, wavy arrows 279. A void 231 is discussed below in connection with FIG. 6C.

FIG. 6B schematically illustrates an embodiment of a wave washer 272 in an uncompressed state. While it is possible to utilize flat washers in certain embodiments, wave washers are advantageous in other embodiments. The azimuthally wavy form of washer 272 is advantageous in that puck 200 can couple with thermal sink 230 at a plurality of points without overconstraining either puck 200 or thermal sink 230 relative to one other. That is, given that only three points form a plane in a mathematical sense, more than three attachment points between puck 200 and thermal sink 230 forms an overconstrained system that imposes very strict mechanical tolerances on the planarity of attachment points between thermal sink 230 and protrusions 268 of puck 200. Use of a wave washer 272 allows for looser planarity tolerances in such features because washer 272 will provide mechanical coupling throughout a range of compression, rather than requiring attachment points of the respective components to lie along a perfectly planar surface. Similarly, wave washer 272's range of compression allows for local thermal expansion effects in puck 200 and/or thermal sink 230. In certain embodiments, wave washer 272 has an uncompressed thickness 273 that is at least double a compressed thickness 274; in other embodiments wave washer 272 has an uncompressed thickness 273 that is at least five times compressed thickness 274. Although washer 272 is shown in flat cross-sectional profile in FIG. 6A for illustrative clarity, it will be appreciated upon reading and understanding the present disclosure that fastener 270 may not be tightened to the point of flattening wave washer 272 completely, such that some waviness will exist in many, if not all, instances of wave washer 272 as installed. Also, when used, wave washer 272 reduces thermal communication between protrusion 268 and thermal sink 230 by forcing heat to pass from protrusion 268 to a local peak where washer 272 contacts protrusion 268, then laterally within washer 272 to a local trough where washer 272 contacts thermal sink 230. Washers 272 may be formed, for example, of beryllium copper. Certain embodiments utilize two washers 272, one on either side of thermal sink 230, as shown, while other embodiments utilize only a single washer 272, typically between protrusion 268 and thermal sink 230.

FIG. 6C provides an upwardly looking, bottom plan view in the vicinity of fastener 270. In FIG. 6C, a broken line 6A-6A indicates the cross-sectional plane shown in FIG. 6A. Thermal sink 230 forms one or more voids 231 within thinned region 235 near fastener 270. Voids 231 further reduce thermal communication between puck 200 and thermal sink 230. The number and arrangement of voids 231 in thermal sink 230 that are shown in FIG. 6C are not required; it will be appreciated upon reading and understanding the present disclosure that voids 231 can be modified in size, number and arrangement to adjust thermal coupling characteristics between thermal sink 230 and puck 200. For example, thermal coupling between thermal sink 230 and puck 200 could be reduced further still be providing a second set of voids 231, radially outward from voids 231 as shown in FIG. 6C, and by staggering the arrangement of the additional set with respect to the voids 231 shown, in order to lengthen a thermal path between protrusion 268 and the body of thermal sink 230. Also, although FIG. 6C shows an outer edge of thinned region 235 as being coincident with outer edges of voids 231, this is not always necessarily the case. Certain embodiments may have voids 231 that are well within edges of thinned region 235, or that extend partially into thermal sink 230 outside of thinned region 235. Similarly, the number, placement and wall thicknesses of protrusions 268 can be modified to achieve higher or lower thermal conduction between puck 200 and thermal sink 230.

A further advantage of providing at least one thermal break 210 that intersects a top surface of puck 200 is that certain mechanical features may be disposed at least partially within the thermal break such that the mechanical features do not generate a thermal anomaly on the surface of puck 200. For example, a wafer chuck commonly provides lift pins that can be used to raise a wafer to a small distance off of the chuck to facilitate access by wafer handling tools (typically using a paddle or other device that, after the wafer is raised, is inserted between the wafer and the chuck). However, the lift pins typically retract into holes in the chuck, and such holes and lift pin structure can locally affect wafer temperature during processing. When a thermal break intersects a top surface of puck 200, a location already exists for such a mechanism to be placed without introducing a thermal anomaly.

Figure 7:
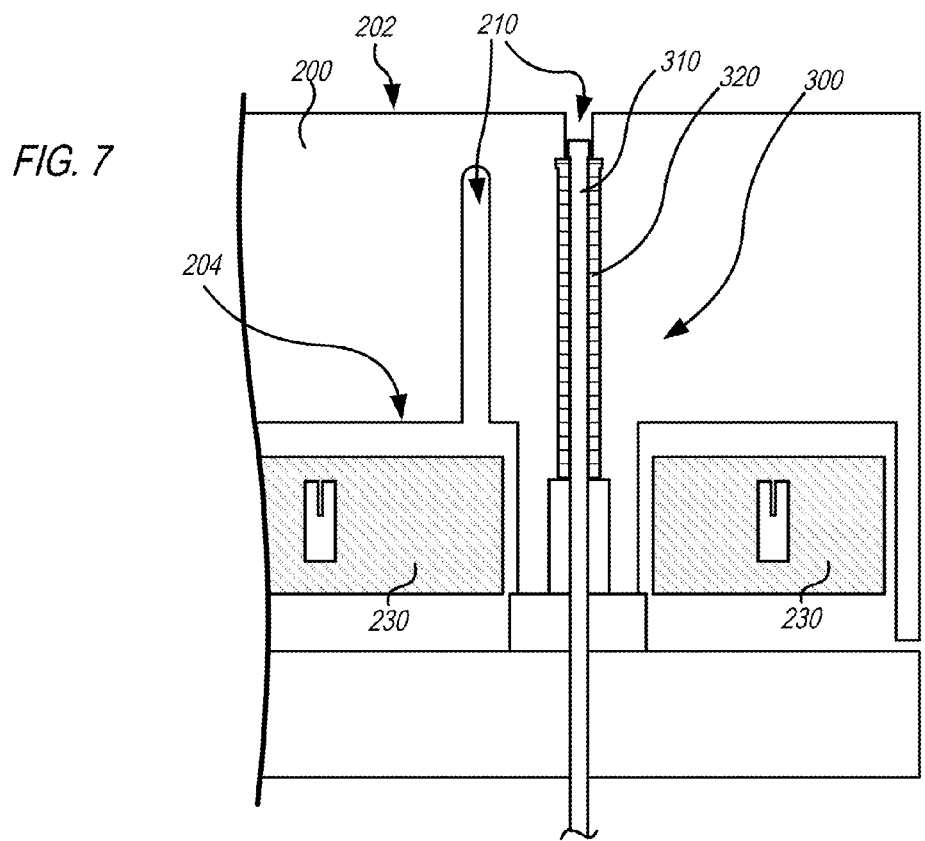
FIG. 7 schematically illustrates a lift pin mechanism disposed within a thermal break, in accord with an embodiment.

FIG. 7 schematically illustrates a portion of a wafer chuck that has a lift pin mechanism 300 that controls a lift pin 310, disposed within a thermal break 210. Portions of heaters 220 and optional thermal sink 230 are also shown. The cross-sectional plane illustrated in FIG. 7 passes through a center of mechanism 300 such that the components thereof are within a lower portion of one thermal break 210. In and out of the plane shown, puck 200, thermal break 210 and thermal sink 230 may have profiles like those shown in FIGS. 3 and 4, so that the thermal break 210 in which mechanism 300 is disposed will continue along its arc through puck 200 (see FIG. 8). Also, lift pin mechanism 300 is limited to a fairly small azimuthal angle relative to the central axis of puck 200 (again, see FIG. 8). That is, if a cross sectional plane were taken at a distance into or out of the plane shown in FIG. 7, the bottom surface of puck 200 would be continuous along the same plane where bottom surface 204 is indicated in FIG. 7, and thermal sink 230 would be continuous under puck 200. The small size of lift pin mechanism 300 limits thermal deviation of puck 200 in the area of lift pin mechanism 300. FIG. 7 shows lift pin 310 in a retracted position, wherein it will not create a thermal anomaly on the surface of puck 200.

Figure 8:
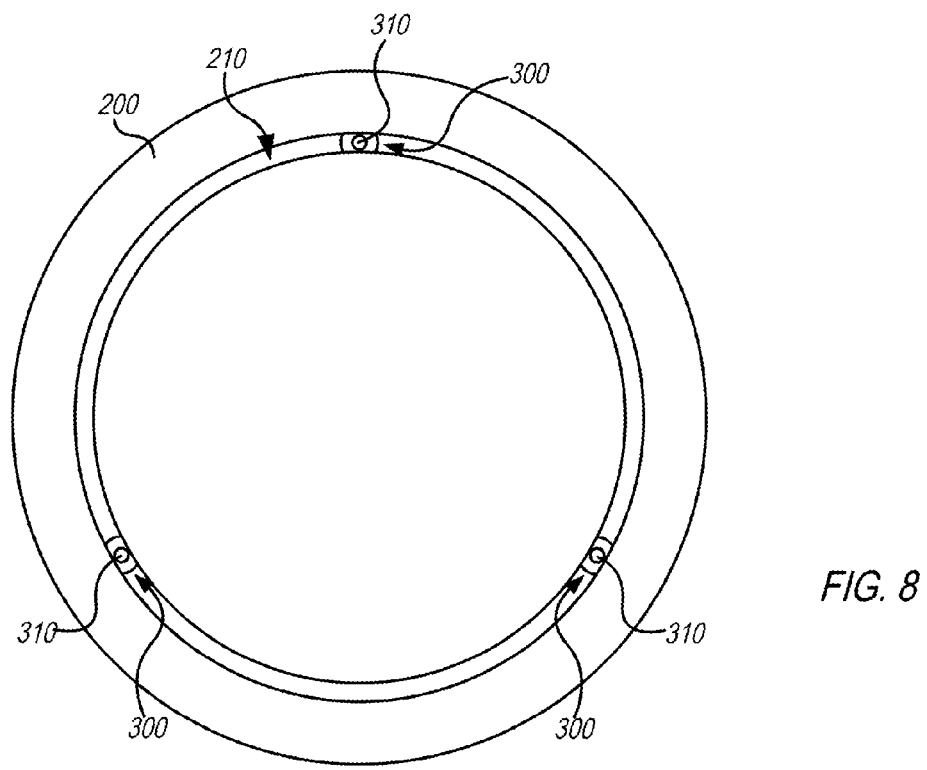
FIG. 8 schematically illustrates, in a plan view, a three lift pin arrangement where lift pins are disposed within a thermal break, in accord with an embodiment.

FIG. 8 schematically illustrates, in a plan view, a three lift pin arrangement where lift pins 310 are disposed within a thermal break 210. FIG. 8 is not drawn to scale, in particular, thermal break 210 is exaggerated so as to show lift pin mechanisms 300 and lift pins 310 clearly. Because lift pins 310 retract well below the average surface of puck 200 into thermal break 210, lift pins 310 do not generate a spatial thermal anomaly during processing, such that portions of a workpiece being processed at the locations of lift pins 310 (e.g., specific integrated circuits located at the corresponding locations of a semiconductor wafer) experience processing that is consistent with processing elsewhere on the workpiece.

Figure 9:
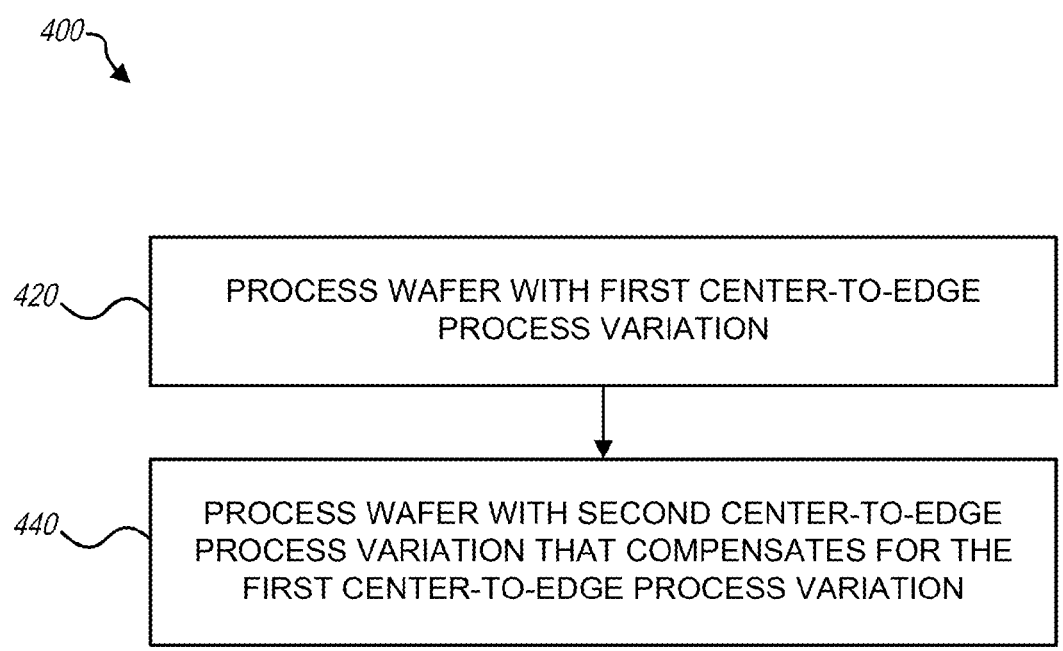
FIG. 9 is a flowchart of a method for processing a wafer or other workpiece, in accord with an embodiment.
Figure 10:
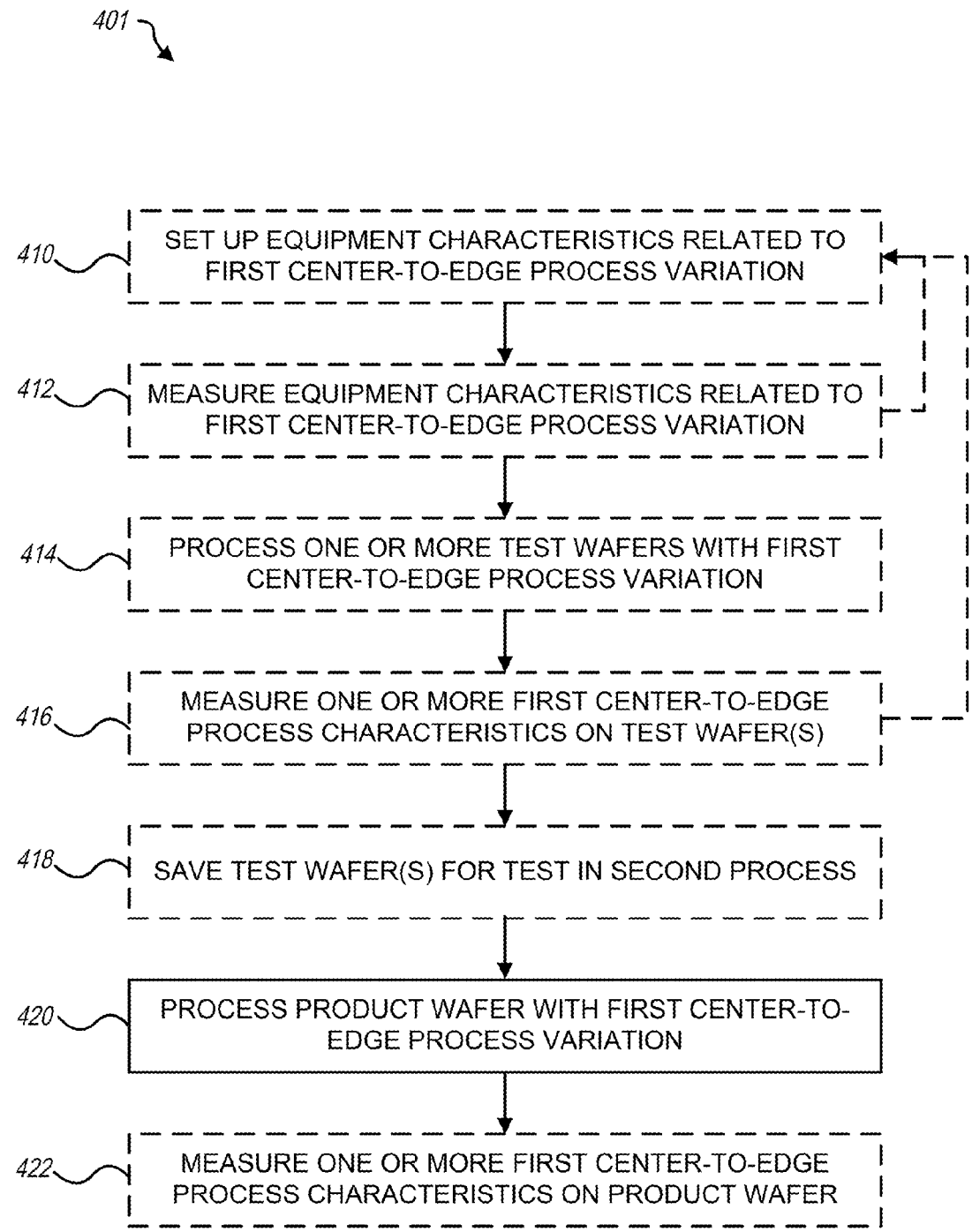
FIG. 10 is a flowchart of a method that includes, but is not limited to, one step of the method of FIG. 9.
Figure 11:
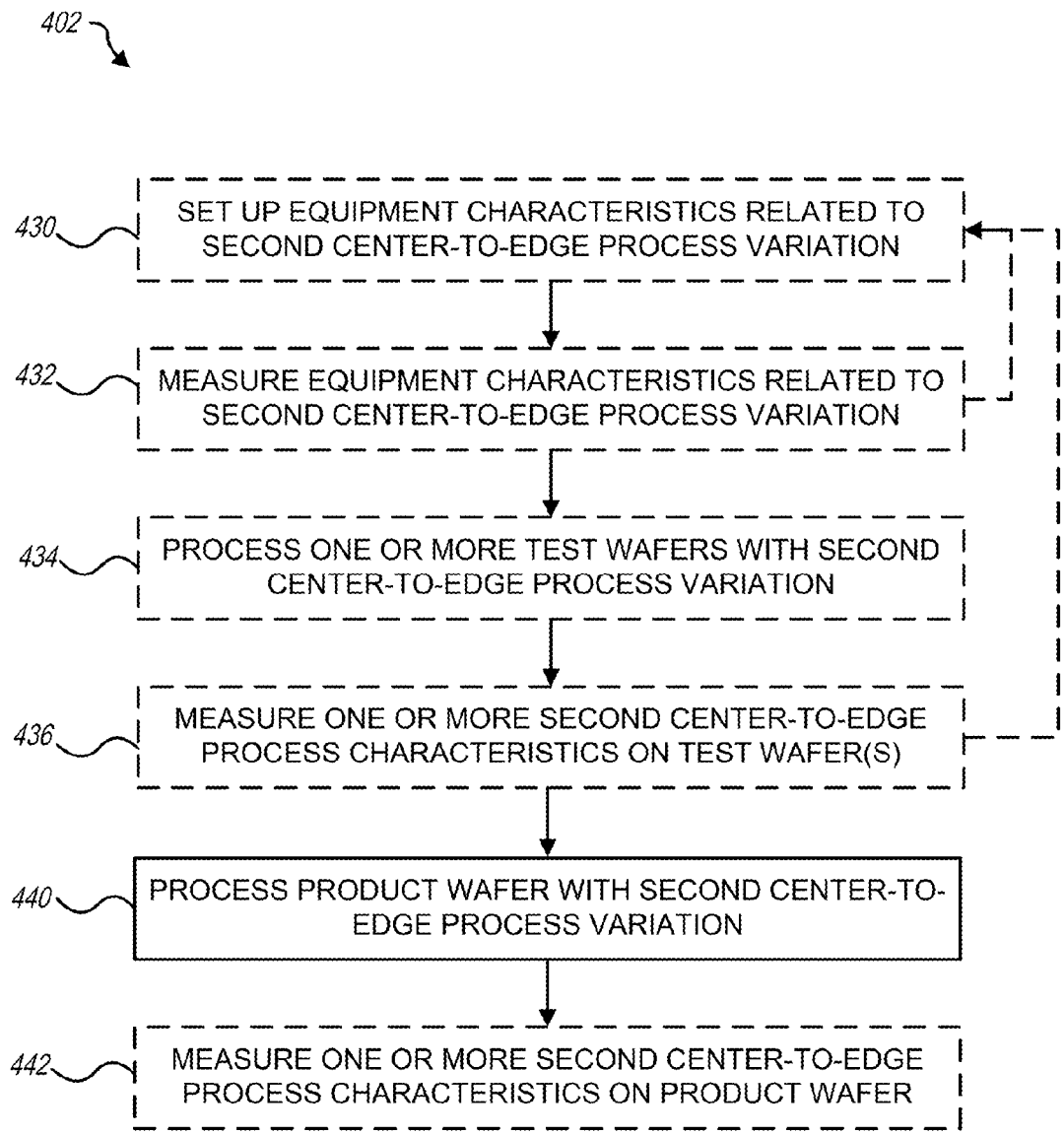
FIG. 11 is a flowchart of a method that includes, but is not limited to, another step of the method of FIG. 9.

FIG. 9 is a flowchart of a method 400 for processing a wafer or other workpiece (simply called a "product wafer" hereinafter for convenience, understanding that the concepts may apply to workpieces other than wafers). Method 400 may be uniquely enabled by the thermal management apparatus described in connection with FIGS. 2-8 that can be used to provide explicit center-to-edge thermal control, which in turn enables explicit center-to-edge process control. A first step 420 of method 400 processes the product wafer with a first center-to-edge process variation. A second step 440 of method 400 processes the product wafer with a second center-to-edge process variation that compensates for the first center-to-edge variation. Typically, one or the other of 420 or 440 will be carried out in equipment or in a process environment that unintentionally or uncontrollably generates the associated center-to-edge process variation (the "uncontrolled variation" hereinafter) but this is not required. Also, typically, the other is carried out in equipment such as that described herein, such that another center-to-edge process variation (the "controlled variation" hereinafter) is introduced through thermal management techniques that allow the center and edge portions of the product wafer to be explicitly controlled to provide a corresponding, inverse process variation. However, the uncontrolled variation and the controlled variation can occur in either order. That is, 420 may introduce either the uncontrolled or the controlled variation, and 440 may introduce the other of the uncontrolled and the controlled variation. FIGS. 10 and 11 provide additional guidance to those skilled in the art to enable useful exercise of method 400.

FIG. 10 is a flowchart of a method 401 that includes, but is not limited to, step 420 of method 400. All of 410-418 and 422 shown in FIG. 10 are considered optional, but in embodiments may be helpful, in execution of method 400 to achieve useful wafer processing results.

Step 410 sets up equipment characteristics that are related to the first center-to-edge process variation, which will be produced at 420. For example, when 420 is expected to introduce the controlled variation, 410 may involve providing equipment parameters such as heater settings that will provide a controlled center-to-edge temperature variation. Equipment such as described in FIGS. 2-8 herein is useful in providing a controlled center-to-edge temperature variation. Step 412 measures equipment characteristics that are related to the first center-to-edge process variation. Process knowledge may be acquired over time about what equipment settings, or measured equipment characteristics, are successful in generating a known center-to-edge process variation (or at least providing a process variation that is stable, albeit unintentional). In consideration of this process knowledge, method 401 may optionally return from 412 to 410 to adjust equipment characteristics, if the equipment characteristics measured in 412 can likely be improved. Step 414 processes one or more test wafers that receive the first center-to-edge process variation. Step 416 measures one or more characteristics of the first center-to-edge process variation on the test wafer(s) processed in step 414. Method 401 may optionally return from 416 to 410 to adjust equipment characteristics in light of the center-to-edge process characteristics measured in 416. Any test wafers processed in 414 may optionally be saved in 418, for testing in the second process (e.g., the process to be executed later, in 440). Also, 414 may be performed in parallel with 420. That is, when process equipment is appropriately configured, test wafers may be processed at the same time as product wafers (for example, if the first process is a so-called "batch" process like dipping a cassette of wafers into a liquid bath, processing a set of wafers together in an ampoule, diffusion furnace or deposition chamber, or the like).

Step 420 processes a product wafer with the first center-to-edge process variation. Step 422 measures one or more first center-to-edge characteristics on the product wafer, to generate data for equipment process control purposes, for correlation to yield or performance of the product wafer, and/or for use in correlating to information surrounding step 440, as described further below.

FIG. 11 is a flowchart of a method 402 that includes, but is not limited to, step 440 of method 400. All of 430-436 and 442 shown in FIG. 11 are considered optional, but in embodiments may be helpful, in execution of method 400 to achieve useful wafer processing results.

Step 430 sets up equipment characteristics that are related to the second center-to-edge process variation, which will be produced at step 440. For example, when 440 is expected to introduce the controlled variation, 430 may involve providing equipment parameters such as heater settings that will provide a controlled center-to-edge temperature variation. Equipment such as described in FIGS. 2-8 herein is useful in providing a controlled center-to-edge temperature variation. Step 432 measures equipment characteristics that are related to the second center-to-edge process variation. In consideration of process knowledge, as discussed above, method 402 may optionally return from 432 to 430 to adjust equipment characteristics in light of the equipment characteristics measured in 432. Step 434 processes one or more test wafers that receive the second center-to-edge process variation; the test wafer(s) processed in 434 may include one or more test wafers saved from the first process step in 418, above. Step 436 measures one or more characteristics of the second center-to-edge process variation on the test wafer(s) processed in 434. In consideration of previously acquired process knowledge, method 402 may optionally return from 436 to 430 to adjust equipment characteristics in light of the center-to-edge process characteristics measured in 436.

Step 440 processes a product wafer with the second center-to-edge process variation. Also, although not shown in method 402, additional test wafers could certainly be processed in parallel with the product wafer. Step 442 measures one or more first center-to-edge characteristics on the product wafer, to generate data for equipment process control purposes, for correlation to yield or performance of the product wafer, and/or for use in correlating to information surrounding 420, as described above. Such measurements could also be performed on any test wafer that was processed in parallel with the product wafer, but in any case 442 will generally not further alter any condition present on the product wafer. That is, the results of 420 and 440 will be fixed in the product wafer at the conclusion of 440 irrespective of any further testing done.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Plasma processing of workpieces other than wafers may also benefit from improved processing uniformity, and are considered within the scope of the present disclosure. Thus, characterization of the chucks herein as "wafer chucks" for holding "wafers" should be understood as equivalent to chucks for holding workpieces of any sort, and "wafer processing systems" as similarly equivalent to processing systems.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A workpiece holder that positions a workpiece for processing, the workpiece holder comprising:
   a substantially cylindrical puck, wherein:
      the puck is characterized by a cylindrical axis, a puck radius about the cylindrical axis, and a substantially planar top surface, and
      a direction parallel to the top surface is defined as a lateral direction;
   a first heating device disposed in thermal communication with a radially inner portion of the puck;
   a second heating device disposed in thermal communication with a radially outer portion of the puck, wherein the first and second heating devices are independently controllable with respect to one another; and
   a thermal sink disposed in thermal communication with the puck,
   wherein:

the first and second heating devices are in greater respective degrees of thermal communication with the puck, than a degree of thermal communication of the thermal sink with the puck; and
a plurality of attachment points between the thermal sink and the puck provides substantially all of the thermal communication of the thermal sink with the puck, wherein for at least one of the attachment points:
the puck forms a protrusion facing the thermal sink;
the thermal sink forms an aperture; and
a fastener passes through the aperture and couples within the protrusion.

2. The workpiece holder of claim 1, wherein at least one of the first heating device and the second heating device comprises a cable heater disposed within a groove defined within a bottom surface of the puck.

3. The workpiece holder of claim 2, further comprising a heater cap that is placed within the groove to hold the cable heater in place, the heater cap being secured to the puck along at least part of an arc length of the cable heater.

4. The workpiece holder of claim 1, wherein the puck is at least ten inches in diameter and the plurality of attachment points comprise at least twenty attachment points.

5. The workpiece holder of claim 4, wherein the puck is at least twelve inches in diameter and the plurality of attachment points comprise at least thirty attachment points.

6. The workpiece holder of claim 1, wherein at the at least one of the attachment points:
the protrusion defines a first lateral extent, and
the thermal sink defines a cavity that faces a bottom surface of the puck, the cavity being partially bounded by a thinned portion of the thermal sink that is reduced in thickness around the aperture, the cavity defining a second lateral extent that is greater than the first lateral extent, such that a lateral gap exists between the protrusion and sides of the cavity.

7. The workpiece holder of claim 6, wherein the thermal sink defines one or more voids adjacent to the aperture and within the thinned portion, to limit thermal transfer through a thermal path extending from the puck, through the fastener and material of the thermal sink surrounding the fastener, to the thermal sink.

8. The workpiece holder of claim 1, further comprising a wave washer disposed about the fastener between the thermal sink and the protrusion, wherein:
the wave washer has a net uncompressed thickness that is at least twice its compressed thickness; and
the fastener is partially tightened without flattening the wave washer completely, to allow for local thermal expansion effects.

9. The workpiece holder of claim 1, wherein the thermal sink comprises a metal plate that defines one or more fluid channels, and a heat exchange fluid flows through the fluid channels to define a reference temperature of the thermal sink.

10. The workpiece holder of claim 1, wherein the puck is characterized by a puck thickness,
and wherein the substantially cylindrical puck defines one or more radial thermal breaks between the radially inner and radially outer portions of the puck,
each thermal break being characterized as a radial recess that intersects at least one of the top surface and a bottom surface of the substantially cylindrical puck, wherein the radial recess is characterized by:
a thermal break depth that extends from the top surface or the bottom surface of the puck through at least half of the puck thickness,
and a thermal break radius that is disposed symmetrically about the cylindrical axis, and is at least one-half of the puck radius.

11. The workpiece holder of claim 1, wherein the protrusion is integrally formed with the puck, and protrudes from a bottom surface of the puck toward the thermal sink.

12. The workpiece holder of claim 1, wherein the fastener couples with an internally threaded surface of the protrusion.

13. The workpiece holder of claim 1, wherein the attachment points are substantially evenly distributed across each of the inner and outer portions of the puck.

14. A workpiece holder that positions a workpiece for processing, the workpiece holder comprising:
a substantially cylindrical puck that is characterized by a cylindrical axis and a substantially planar top surface, wherein the puck defines two radial thermal breaks,
a first one of the thermal breaks being characterized as a radial recess that intersects a bottom surface of the puck at a first radius, and extends from the bottom surface through at least one-half of a thickness of the puck,
a second one of the thermal breaks being characterized as a radial recess that intersects the top surface of the puck at a second radius that is greater than the first radius, and extends from the top surface through at least one-half of the thickness of the puck,
the first and second thermal breaks defining a demarcation between a radially inner portion of the puck and a radially outer portion of the puck;
and wherein the puck comprises:
a first heating device embedded within the radially inner portion of the puck, and
a second heating device embedded within the radially outer portion of the puck;
the workpiece holder further comprising a thermal sink that extends substantially beneath the bottom surface of the puck, the thermal sink comprising a metal plate that flows a heat exchange fluid through channels defined therein, to maintain a reference temperature for the puck;
wherein the thermal sink mechanically and thermally couples with the puck at a plurality of attachment points that provide a degree of thermal communication between the thermal sink and the puck that is less than a degree of thermal communication between each of the first and second heating devices and the puck.

15. The workpiece holder of claim 14, wherein the thermal sink comprises a metal plate that defines one or more fluid channels, and wherein a heat exchange fluid flows through the one or more fluid channels to define a reference temperature of the thermal sink.

16. The workpiece holder of claim 14, wherein a plurality of attachment points between the thermal sink and the puck provides substantially all of the thermal communication of the thermal sink with the puck.

17. The workpiece holder of claim 16, wherein the attachment points are substantially evenly distributed across each of the inner and outer portions of the puck.

18. The workpiece holder of claim 16, wherein the puck is at least ten inches in diameter and the plurality of attachment points comprise at least twenty attachment points.

19. The workpiece holder of claim 18, wherein the puck is at least twelve inches in diameter and the plurality of attachment points comprise at least thirty attachment points.

20. The workpiece holder of claim 14, wherein at least one of the first heating device and the second heating device comprises a cable heater disposed within a groove defined within a bottom surface of the puck.

21. The workpiece holder of claim 20, further comprising a heater cap that is placed within the groove to hold the cable heater in place, the heater cap being secured to the puck along at least part of an arc length of the cable heater.

* * * * *